United States Patent
Cha et al.

(10) Patent No.: US 7,623,403 B2
(45) Date of Patent: Nov. 24, 2009

(54) NAND FLASH MEMORY DEVICE AND METHOD OF OPERATING THE SAME

(75) Inventors: Jae-Won Cha, Icheon-si (KR); Sam-Kyu Won, Icheon-si (KR); Kwang-Ho Baek, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 162 days.

(21) Appl. No.: 11/949,668

(22) Filed: Dec. 3, 2007

(65) Prior Publication Data

US 2009/0027968 A1 Jan. 29, 2009

(30) Foreign Application Priority Data

Jul. 25, 2007 (KR) .................. 10-2007-0074579

(51) Int. Cl.
*G11C 17/18* (2006.01)
(52) U.S. Cl. ............... 365/225.7; 365/201; 365/189.12; 365/185.17
(58) Field of Classification Search ............... 365/225.7, 365/201, 189.12, 185.17
See application file for complete search history.

(56) References Cited

U.S. PATENT DOCUMENTS

| 6,504,771 | B2 | 1/2003 | Shionoya |
| 6,649,931 | B2 | 11/2003 | Honma et al. |
| 2002/0039322 | A1 | 4/2002 | Tran et al. |
| 2005/0240838 | A1* | 10/2005 | Iwai .......................... 714/718 |

FOREIGN PATENT DOCUMENTS

| JP | 2002-042484 | 2/2002 |
| JP | 2005-011451 | 1/2005 |
| KR | 1019990069873 A | 9/1999 |
| KR | 1020000062552 A | 10/2000 |

* cited by examiner

*Primary Examiner*—Thong Q Le
(74) *Attorney, Agent, or Firm*—Townsend and Townsend and Crew LLP

(57) ABSTRACT

A NAND flash memory device having memory cells for storing data includes a fuse circuit configured to store option information for operation of the NAND flash memory device as logic codes. A register circuit includes registers for temporarily storing the logic codes stored in the fuse circuit. A test circuit is configured to change the logic code stored in the register circuit and store the changed logic code irrespective of the logic code of the fuse circuit for test operation of the NAND flash memory device. A processor is configured to control operation of the NAND flash memory device.

22 Claims, 5 Drawing Sheets

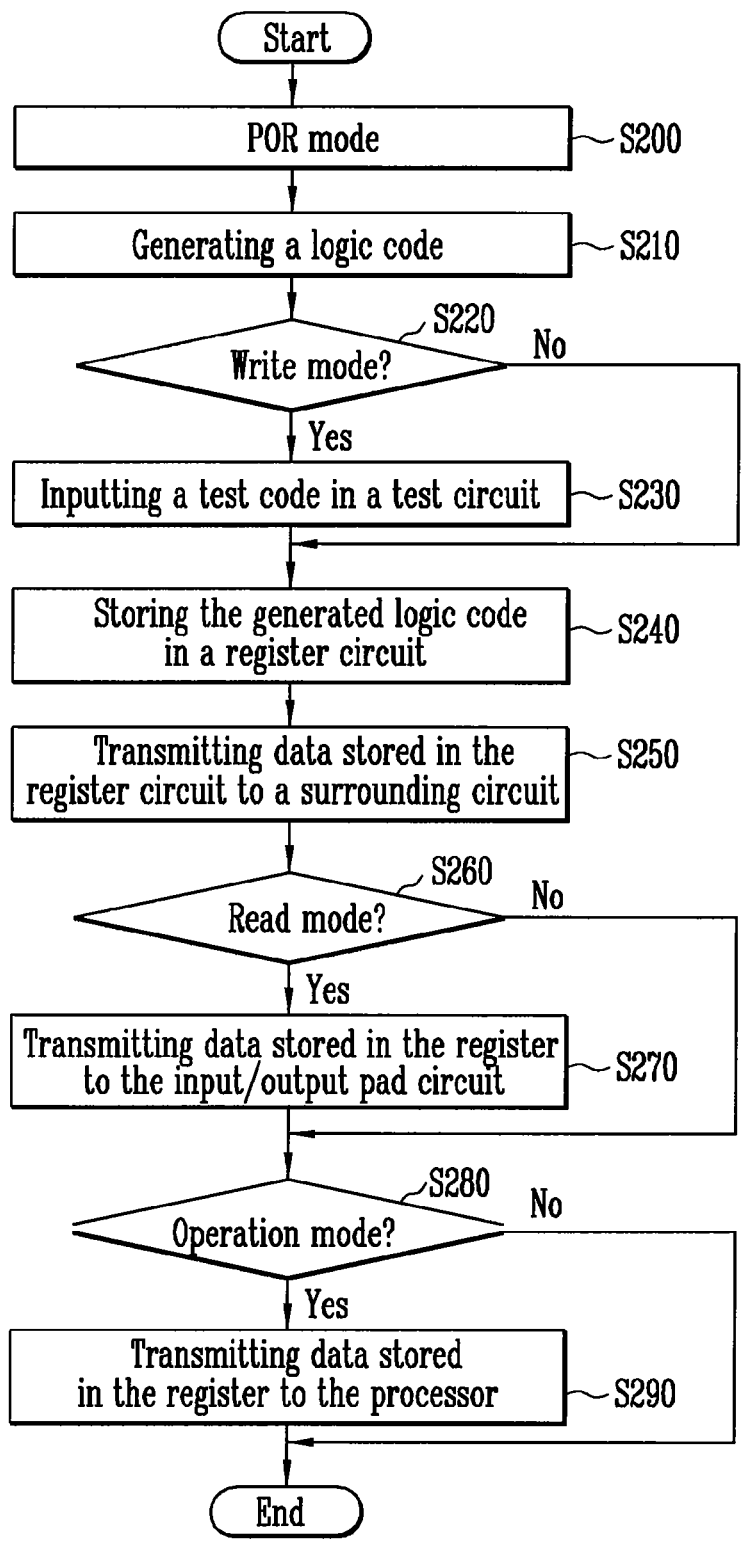

NAND FLASH MEMORY DEVICE AND METHOD OF OPERATING THE SAME

CROSS-REFERENCE TO RELATED APPLICATIONS

This application claims priority from Korean Patent Application No. 2007-74579, filed on Jul. 25, 2007, the contents of which are incorporated herein by reference in its entirety.

BACKGROUND OF THE INVENTION

The present invention relates to a NAND flash memory device. More particularly, the present invention relates to a NAND flash memory device having a fuse and a register circuit.

Recently, efforts for enhancing operation characteristics of mobile devices such as a camcorder, a digital camera, a portable phone, an MP3 (MPEG-1 Layer3) player, etc., have been performed as the demand for mobile devices increases.

A NAND flash memory device employed in the mobile device operates in accordance with an application program. Options associated with the NAND flash memory device are determined in accordance with the operation characteristic of the mobile device.

The number of applications used with mobile devices has increased as new operation techniques are developed. Hence, a technique for providing various options for the NAND flash memory device is required.

SUMMARY OF THE INVENTION

It is a feature of the present invention to provide a NAND flash memory device in which use and change of various options are applied for the purpose of developing various applications and a method of operating the same.

A NAND flash memory device having memory cells for storing data according to one example embodiment of the present invention includes a fuse circuit configured to store option information for operation of the NAND flash memory device as logic codes; a register circuit including registers for temporarily storing the logic codes stored in the fuse circuit; a test circuit configured to change the logic codes stored in the register circuit and store the changed logic codes irrespective of the logic codes of the fuse circuit for test operation of the NAND flash memory device; and a processor configured to control operation of the NAND flash memory device.

A method of operating a NAND flash memory device having a fuse circuit for storing an initial setting value as logic codes and registers for temporarily storing the logic codes outputted from the fuse circuit according to one example embodiment of the present invention includes applying a power source; generating the logic codes to be stored in the fuse circuit in accordance with the applied power source; storing the generated logic codes in the registers in accordance with whether or not a present operation mode is a test mode; and performing an initial setting by transmitting the logic codes stored in the registers to a surrounding circuit for operation of the NAND flash memory device.

BRIEF DESCRIPTION OF THE DRAWINGS

The above and other features and advantages of the present invention will become readily apparent by reference to the following detailed description when considered in conjunction with the accompanying drawings wherein:

FIG. 2 is a flow chart illustrating an operation of a register circuit according to one example embodiment of the present invention.

DESCRIPTION OF SPECIFIC EMBODIMENTS

Embodiments of the present invention will be explained in detail with reference to the accompanying drawings.

Figure 1A:
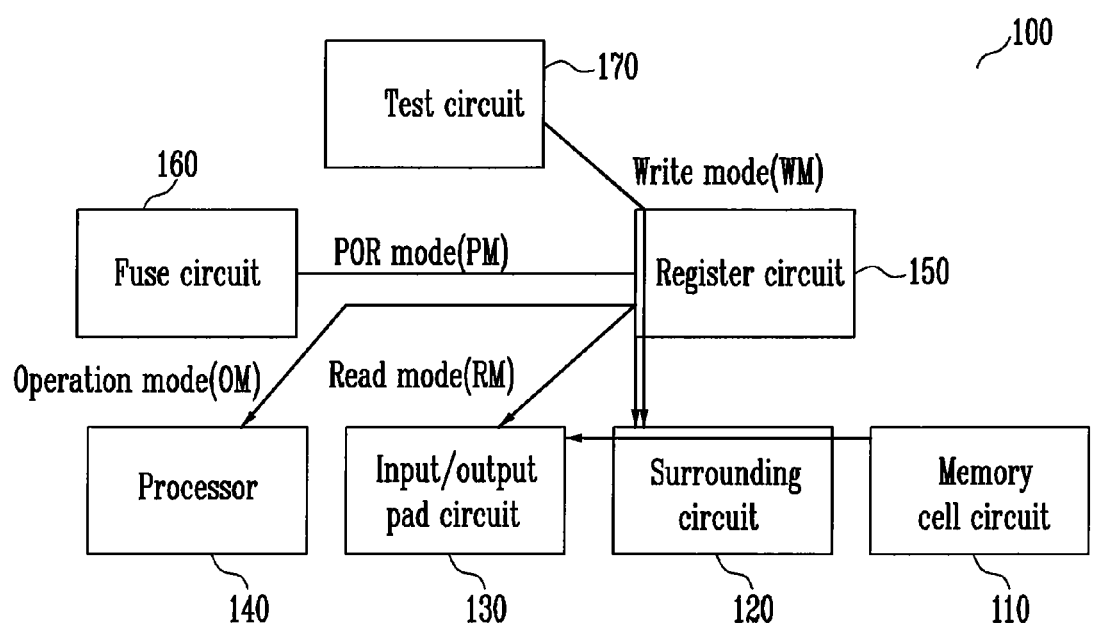
FIG. 1A is a block diagram illustrating a NAND flash memory device according to one example embodiment of the present invention.

FIG. 1A is a block diagram illustrating a NAND flash memory device according to one example embodiment of the present invention.

In FIG. 1A, a NAND flash memory device 100 of the present embodiment includes a memory cell circuit 110 for storing data, a surrounding circuit 120 for storing data in the memory cell circuit 110 or reading data from the memory cell circuit 110, an input/output pad circuit 130 for inputting data outputted from an outside device to the memory cell circuit 120 through the surrounding circuit 120 or providing data outputted from the memory cell circuit 120 to the outside device through the surrounding circuit 120, a processor 140 for controlling operation of the NAND flash memory device, a fuse circuit 160 for outputting a logic code LC for controlling options for operation of the NAND flash memory device in accordance with a combination of a cutting state of a fuse and a metal option circuit, a register circuit (e.g., extra register RAM) 150 for storing the logic code LC outputted from the fuse circuit 160, and a test circuit 170 for controlling the operation of the NAND flash memory device 100 in place of the processor 140 when the NAND flash memory device 100 is tested.

The memory cell circuit 110 has a plurality of memory cells to which data are programmed. Operation of programming data to the memory cells or reading data from the memory cells is performed by the surrounding circuit 120.

The surrounding circuit 120 includes a page buffer circuit (not shown), an X decoder (not shown) and a Y decoder (not shown), etc.

The input/output pad circuit 130 transmits data provided from an outside device to the memory cell circuit 110 through the surrounding circuit 120, and transmits data read from the memory cell circuit 110 to an outside device through the surrounding circuit 120.

The processor 140 is a micro-processor, and controls operation of the NAND flash memory device 100.

The register circuit 150 has a plurality of registers comprising an extra register RAM.

Each of the registers temporarily stores the logic code LC outputted from the fuse circuit 160 and outputs the stored logic code LC to the surrounding circuit 120, the input/output pad circuit 130 or the processor 140.

Each of the registers in the register circuit 150 has one latch or two latches, and is coupled to a sub-fuse circuit having one bit.

The fuse circuit 160 includes a plurality of sub-fuse circuits for outputting the logic code LC having one bit.

Each of the sub-fuse circuits stores the logic code LC provided for operation of the NAND flash memory device 100 through fuse cutting. The stored logic code LC is transmitted to a corresponding register when power is turned on.

The registers provide the transmitted logic code LC to the surrounding circuit 120, the input/output pad circuit 130 or the processor 140.

The registers 151 and 152 store the logic code LC having one bit.

The surrounding circuit 120, the input/output pad circuit 130 or the processor 140 receives the logic code LC outputted from the registers 151 and 152, and perceives the received logic code LC as option information.

When operation of the NAND flash memory device 100 is started, a setting value set at an initial time is determined in accordance with the perceived option information. The setting value has voltage information or priority order information required for an initial setting of the NAND flash memory device 100. The voltage information is needed for a program operation or a read operation.

The testing circuit 170 stores a certain test code TC in the registers 151 and 152 of the register circuit 150 to test the NAND flash memory device 100. The initial setting value may be changed in accordance with the stored test code TC.

Operations of the fuse circuit 160 and the register circuit 150 in the NAND flash memory device have four operation modes described below.

The operation modes include a power on test mode PM (POR mode), a write mode WM, a read mode RM and an operation mode OP.

The PM is a mode for initializing the NAND flash memory device 100 when the power is turned on at the initial time. In the PM mode, each sub-fuse circuit in the fuse circuit 160 outputs the logic codes LC set through the fuse cutting, and the logic codes LC are stored in the registers of the register circuit 150. The logic codes LC stored in the register circuit 150 are transmitted to the surrounding circuit 120.

The WM is a mode for storing the test code TC in the register 150 to set a test configuration when the test circuit 170 tests operation of the NAND flash memory device 100. In the WM, a desired test code TC is stored in the registers 151 and 152 of the register circuit 150 irrespective of the fuse cutting state of the fuse circuit 160. The NAND flash memory device 100 changes the initial setting value in accordance with the stored test code TC so that the NAND flash memory device 100 is tested.

The RM is a mode for reading the logic code LC stored in the register circuit 150. In the RM, the logic code LC stored in the register circuit 150 is directly outputted to the input/output pad circuit 130.

The OM is a mode for transmitting the logic codes LC stored in the register circuit 150 to the process 140 or the surrounding circuit 120. The initial setting value for the operation of the NAND flash memory device is determined in accordance with a combination of the transmitted logic codes LC.

Hereinafter, the register circuit 150 and the fuse circuit 160 will be described in detail.

Figure 1B:
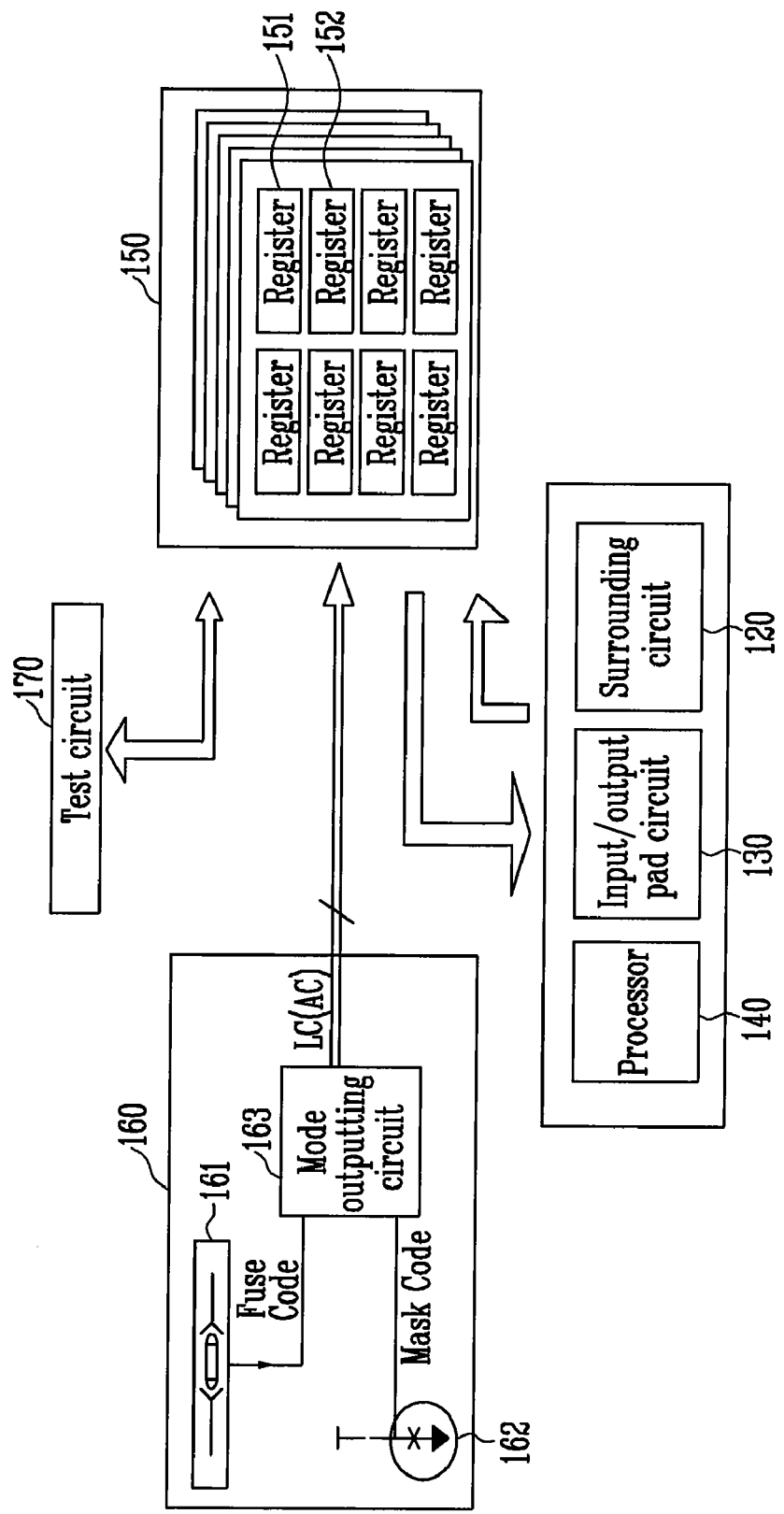
FIG. 1B is a block diagram illustrating the NAND flash memory device of FIG. 1A.

FIG. 1B is a block diagram illustrating the NAND flash memory device of FIG. 1A.

In FIG. 1B, the register circuit 150 of the NAND flash memory device 100 has the registers 151 and 152 as mentioned above.

The fuse circuit 160 includes the sub-fuse circuits as shown in FIG. 1B.

Each of the registers 151 and 152 is coupled to the sub-fuse circuits of the fuse circuit 160.

The sub-fuse circuit has a fuse section 161, a metal option circuit 162 and a code outputting circuit 163.

Hereinafter, the sub-fuse circuit will be described with reference to the accompanying drawings.

Figure 1C:
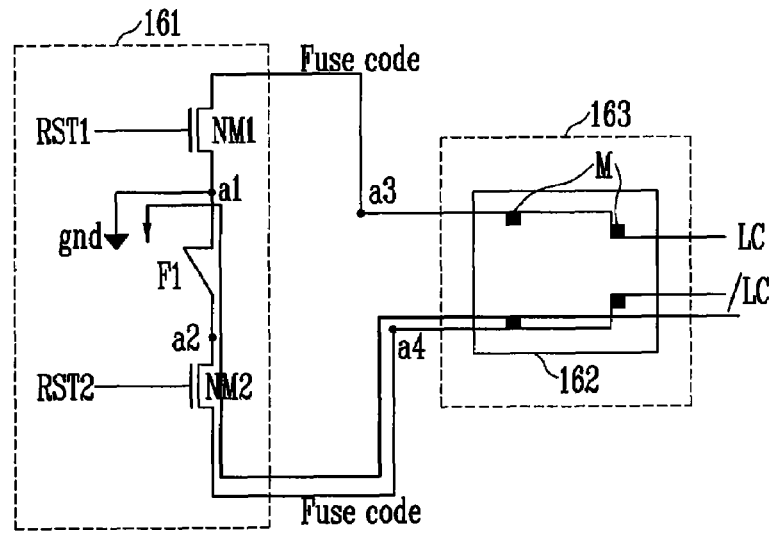
FIG. 1C is a view illustrating a sub-fuse circuit of FIG. 1A.

FIG. 1C is a view illustrating the sub-fuse circuit of FIG. 1A.

In FIG. 1C, the sub-fuse circuit includes the fuse section 161 having two N-MOS transistors NM1 and NM2 and one fuse F1, the metal option circuit 162 and the code outputting circuit 163.

The N-MOS transistor NM1 of the fuse section 161 is coupled between a node a1 and a node a3. A first reset control signal RET1 is inputted to a gate of the N-MOS transistor NM1.

The N-MOS transistor NM2 is coupled between a node a2 and a node a4. A second reset control signal RST2 is inputted to a gate of the N-MOS transistor NM2.

Fuse codes are outputted from the node a3 and the node a4 in accordance with cutting of the fuse F1.

The fuse F1 is coupled between the node a1 and the node a2. In addition, the node a1 is coupled to a ground gnd. Ground voltage means a low level logic signal. Accordingly, a logic signal having a low level is outputted to the node a3 or the node a4 in accordance with cutting of the fuse F1.

The metal option circuit 162 having a plurality of mask codes M, is used in the initial test of flash memory device 100.

In the code outputting circuit 163, the mask code M is coupled to signals outputted from the node a3 and the node a4. The code outputting circuit 163 outputs a logic code LC and an inverted logic code /LC.

The logic code LC and the inverted logic code /LC are inputted to a corresponding register 151 or 152. This will be described in detail with reference to the register circuit described below.

The logic code LC and the inverted logic code /LC are inputted to two terminals of a latch circuit in the register 151 or 152, respectively. The register 151 or 152 may have one latch (the register 151) or two latches (the register 152).

Figure 1D:
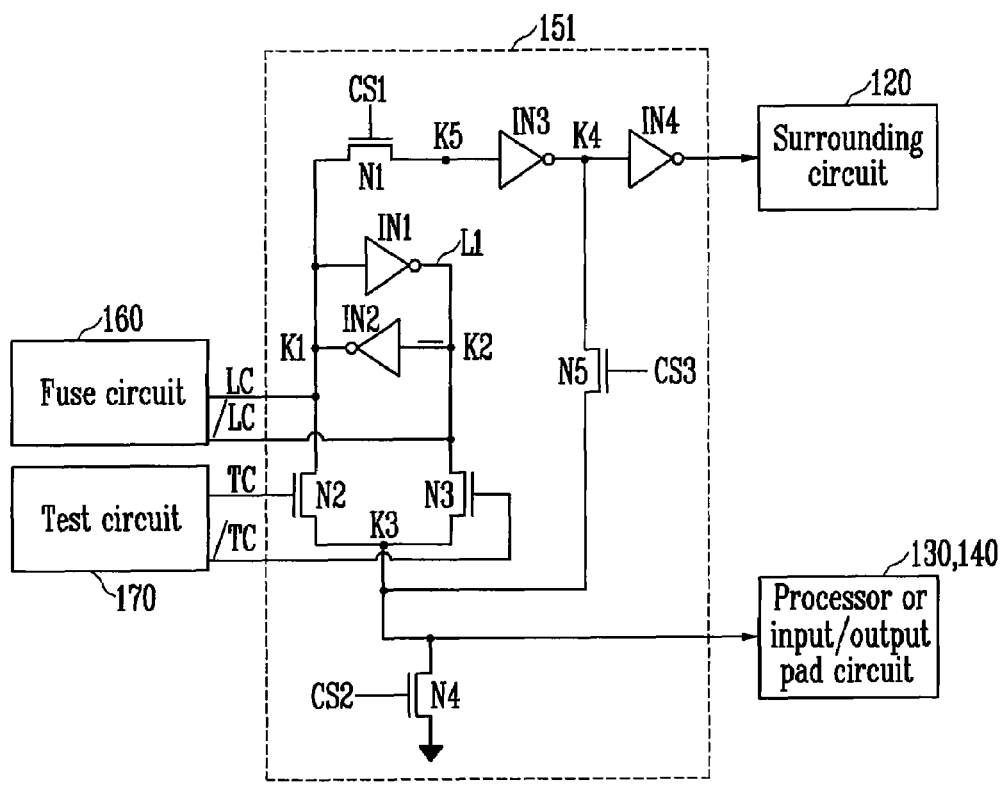
FIG. 1D is a view illustrating circuitry of a register of FIG. 1B according to a first example embodiment of the present invention.

FIG. 1D is a view illustrating circuitry of the register of FIG. 1B according to a first example embodiment of the present invention.

In FIG. 1D, the register 151 having one latch includes first to fifth N-MOS transistors N1 to N5 and first to fourth inverters IN1 to IN4.

The first N-MOS transistor N1 is coupled between a node K1 and a node K5. A first control signal CS1 is inputted to a gate of the first N-MOS transistor N1.

The first inverter IN1 and the second inverter IN2 are coupled between the node K1 and a node K2, thereby forming a first latch L1.

The logic code LC outputted from the fuse circuit 160 is inputted to the node K1.

The inverted logic code /LC outputted from the fuse circuit 160 is inputted to the node K2.

The second N-MOS transistor N2 is coupled between the node K1 and a node K3. The test code TC outputted from the test circuit 170 is inputted to a gate of the second N-MOS transistor N2.

The third N-MOS transistor N3 is coupled between the node K2 and the node K3. An inverted test code /TC outputted from the test circuit 170 is inputted to a gate of the third N-MOS transistor N3.

The fourth N-MOS transistor N4 is coupled between the node K3 and the ground gnd. A second control signal CS2 is inputted to a gate of the fourth N-MOS transistor N4.

The fifth N-MOS transistor N5 is coupled between a node K4 and the node K3. A third control signal CS3 is inputted to a gate of the fifth N-MOS transistor N5.

The processor 140 outputs the first to third control signals CS1 to CS3 to the first N-MOS transistor N1, the fourth N-MOS transistor N4 or the fourth N-MOS transistor N5 in accordance with the mode. As a result, the option information stored in the latch L1 is transmitted to the surrounding circuit 120, the processor 140 or the input/output pad circuit 130.

The third and fourth inverters IN3 and IN4 are coupled between the node K5 and the surrounding circuit 120, and provide the information stored in the latch L1 to the surrounding circuit 120.

The information stored in the latch L1 is also outputted to the processor 140 or the input/output pad circuit 130 through the node K3.

In the PM, the control signals CS1 to CS3 are not inputted to the first N-MOS transistor N1, the fourth N-MOS transistor N4 and the fifth N-MOS transistor N5. Thus, the N-MOS transistors N1, N4 and N5 are turned off. The logic code LC and the inverted logic code /LC outputted from the fuse circuit 160 are stored in the latch L1.

In the OM, the processor 140 transmits the first control signal CS1 and the third control signal CS3 to the gates of the first N-MOS transistor N1 and the fifth N-MOS transistor N5, thereby tuning on the transistors N1 and N5. As a result, the logic code LC stored in the latch L1 is transmitted to the surrounding circuit 120 and the processor 140.

In the WM, the second control signal CS2 is inputted to the fourth N-MOS transistor N4, such that the fourth N-MOS transistor N4 is turned on. In addition, the test circuit 170 outputs the test code TC or the inverted test code /TC, such that the N-MOS transistor N2 or N3 is turned on. As a result, the node K1 or the node K2 is coupled to the ground, such that the node K1 or K2 has a low level logic value.

In the RM, the first N-MOS transistor N1 and the fifth N-MOS transistor N5 are turned on, such that the logic code LC stored in the latch L1 is outputted to the input/output pad circuit 140.

Hereinafter, a process of inputting the logic code LC of the fuse circuit 160 shown in FIG. 1C to the latch L1 of the register 151 will be described in detail.

The first reset control signal RST1 and the second reset control signal RST2 having a high level are inputted in sequence to the fuse circuit 160.

The N-MOS transistor NM1 is turned on in accordance with the inputted first reset control signal RST1. When the fuse F1 is cut, the node a3 is coupled to the ground. As a result, the node a3 has a low level, and the logic code LC has a low level. The logic code LC is stored in the node K1 of the latch L1 in the register 151. Hence, the node K2 maintains a high level logic value in accordance with a characteristic of the latch L1.

The N-MOS transistor NM2 is turned on in accordance with the inputted second reset control signal RST2. However, since the fuse F1 is cut, the node a4 is in a floating state. That is, no logic code is outputted through the node a4. Hence, the data stored in the latch L1 is not changed.

On the other hand, when the first reset control signal RST1 is inputted when the fuse F1 is not cut, the N-MOS transistor NM1 is turned on. Hence, the node a3 has a low level, such that the logic code LC having a low level is provided to the node K1. In addition, the node K2 maintains a high level logic value.

The N-MOS transistor NM2 is turned on in accordance with the second reset control signal RST2, such that the node a4 has a low level. Hence, the inverted logic code /LC is outputted with a low level, and the data stored in the latch L1 of the register 151 are inverted. As a result, the node K2 maintains a low level logic value, and the node K1 maintains a high level logic value.

In short, the logic code LC is stored in the latch L1 in accordance with cutting of the fuse F1 in the fuse circuit 160. The above process of storing the logic code LC in the latch L1 using the cutting of the fuse F1 may also be applied to the register 152 having two latches.

Figure 1E:
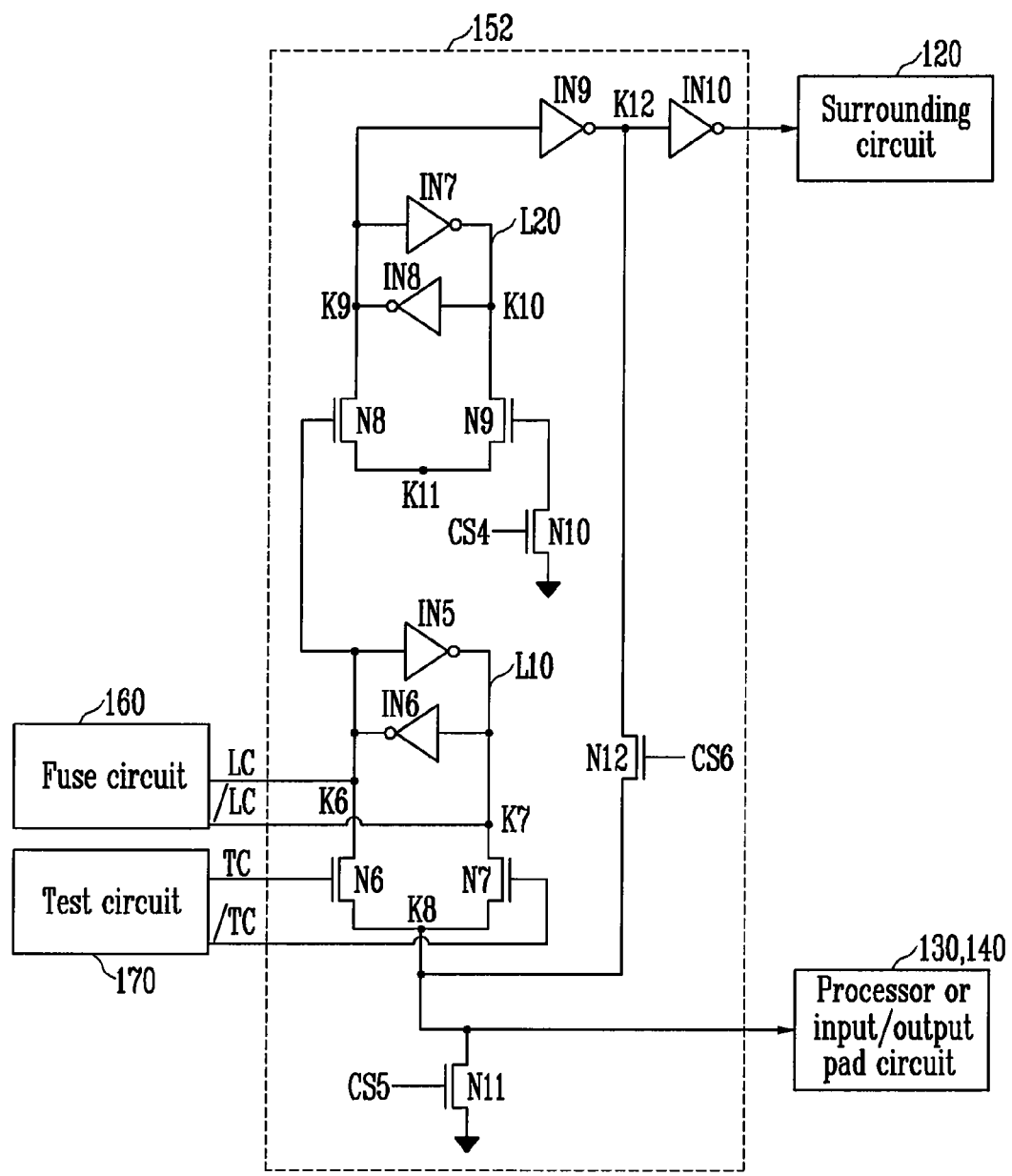
FIG. 1E is a view illustrating circuitry of a register in FIG. 1A according to a second example embodiment of the present invention.

FIG. 1E is a view illustrating circuitry of the register of FIG. 1A according to a second example embodiment of the present invention.

In FIG. 1E, the register 152 having two latches includes sixth to twelfth N-MOS transistors N6 to N12, and fifth to tenth inverters IN5 to IN10.

The fifth inverter IN5 and the sixth inverter IN6 are coupled between a node K6 and a node K7, thereby forming a first latch L10.

The seventh inverter IN7 and the eighth inverter IN8 are coupled between a node K9 and a node K10, thereby forming a second latch 20.

The logic code LC outputted from the fuse circuit 160 is inputted to the node K6, and the inverted logic code /LC outputted from the fuse circuit 160 is inputted to the node K7.

The sixth N-MOS transistor N6 is coupled between the node K6 and a node K8. The test code TC outputted from the test circuit 170 is inputted to a gate of the sixth N-MOS transistor N6.

The seventh N-MOS transistor N7 is coupled between the node K7 and the node K8. The inverted test code /TC is inputted to a gate of the seventh N-MOS transistor N7.

The eighth N-MOS transistor N8 is coupled between the node K9 and a node K11. A gate of the N-MOS transistor N8 is coupled to the node K6.

The ninth N-MOS transistor N9 is coupled between the node K10 and the node K11.

The tenth N-MOS transistor N10 is coupled between the node K11 and a ground. A fourth control signal CS4 is inputted to a gate of the tenth N-MOS transistor N10.

The eleventh N-MOS transistor N11 is coupled between the node K8 and the ground. A fifth control signal CS5 is inputted to a gate of the eleventh N-MOS transistor N11.

The twelfth N-MOS transistor N12 is coupled between a node K12 and the node K8. A sixth control signal CS6 is inputted to a gate of the twelfth N-MOS transistor N12.

The ninth inverter IN9 and the tenth inverter IN10 are coupled in serial between the node K9 and the surrounding circuit 120. The inverters IN9 and IN10 are coupled at the node K12.

Hereinafter, operation of the register 152 will be described in detail.

In the PM, the processor 140 provides the fourth control signal CS4 to the tenth N-MOS transistor N10, thereby turning on the tenth N-MOS transistor N10. The logic code LC and the inverted logic code /LC of the fuse circuit 160 are inputted to the first latch L10. The N-MOS transistors N8 and N9 are turned on or turned off in accordance with the logic code LC and the inverted logic code /LC inputted to the first latch L10. As a result, the node K9 or K10 is coupled to the ground through the tenth N-MOS transistor N10. Accordingly, the second latch L20 stores data opposed to the logic code LC stored in the first latch L1.

The above process of storing the logic code LC in the first latch L10 is identical to that of storing the logic code LC in the latch L1 of FIG. 1D.

In the OM, the processor 140 provides the sixth control signal CS6 to the twelfth N-MOS transistor N12, thereby turning on the twelfth N-MOS transistor N12. As a result, data stored in the second latch L20 are transmitted to the surrounding circuit 120 and the processor 140.

When the RM is performed under the condition that the sixth control signal CS6 is provided, the data stored in the second latch L20 are transmitted to the input/output pad circuit 130.

In the WM, the processor 140 provides the fifth control signal CS5 to the eleventh N-MOS transistor N11, thereby turning on the eleventh N-MOS transistor N11. The test code TC and the inverted test code /TC are latched in the first latch L10 by turning on or turning off the sixth N-MOS transistor N6 or the seventh N-MOS transistor N7.

The test code LC stored in the first latch L10 is inverted, and the inverted test code is stored in the second latch L20. The processor 140 transmits the sixth control signal CS6 to the N-MOS transistor N12 for test operation so that the test code TC may be used in the surrounding circuit 120 and the processor 140.

The register circuit 150 includes the register 151 of the first embodiment and the second register 152 of the second embodiment, or includes only one of the register 151 or the register 152.

The test circuit 170 may read the logic code LC stored in the register circuit 150 and selectively change only data which should be changed before performing the test. This is because input of the test code TC is simple and becomes faster by changing only the test code of the bit which should be changed without changing the test code of every bit.

Hereinafter, operation of the fuse circuit 160 and the register circuit 150 in accordance with the operation mode will be described in detail.

FIG. 2 is a flow chart illustrating an operation of the register circuit according to one example embodiment of the present invention.

In FIG. 2, in step S200, the POR mode PM is performed when power is applied for initially driving the NAND flash memory device 100.

In step S210, the logic code LC is generated and outputted in accordance with the cutting of the fuse in the POR mode PM.

In step S240, when the present mode is not the write mode WM, the generated logic code LC is stored as it is in the registers 151 and 152 of the register circuit 150.

When the operation mode is a test mode in step S220, the logic code LC is disregarded, and the test mode TC of the test circuit 170 is stored in the registers 151 and 152 in step S230.

In step S250, the data stored in the register circuit 150 are transmitted to the surrounding circuit 120 after the logic code LC or the test code TC is stored in the register circuit 150.

The surrounding circuit 120 performs initialization in accordance with the transmitted data.

When the present mode is the read mode RM in step S260, the data stored in the register circuit 150 are outputted to the input/output pad circuit 130 in step S270.

In the OM, the data stored in the register circuit 150 are transmitted to the processor 140 for initialization in step S290.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A NAND flash memory device having memory cells for storing data, the NAND flash memory device comprising:
    a fuse circuit configured to store option information for operation of the NAND flash memory device, wherein the option information comprises logic codes;
    a register circuit comprising registers for temporarily storing the logic codes stored in the fuse circuit;
    a test circuit configured to change the logic codes stored in the register circuit and store the changed logic codes irrespective of the corresponding logic code of the fuse circuit for test operation of the NAND flash memory device; and
    a processor configured to control operation of the NAND flash memory device.

2. The NAND flash memory device of claim 1, further comprising:
    a surrounding circuit configured to store data in the memory cells or read data from the memory cells; and
    an input/output pad circuit configured to input data outputted from the surrounding circuit to an outside device, and input data outputted from the outside device to the surrounding circuit.

3. The NAND flash memory device of claim 1, wherein the fuse circuit includes a plurality of sub-fuse circuits each of which has a fuse and stores a fuse code outputted by the fuse for output of the corresponding logic code.

4. The NAND flash memory device of claim 3, wherein each sub-fuse circuit includes:
    a first switching means and a second switching means turned on in accordance with a first reset control signal and a second reset control signal, thereby outputting a first fuse code and a second fuse code; and
    the fuse coupled between the first switching means and the second switching means.

5. The NAND flash memory device of claim 4, wherein the fuse is cut or coupled between a first node and a second node, the first node is coupled to a ground, the first switching means is coupled between the first node and a third node, and the second switching means is coupled between the second node and a fourth node,
    wherein the first reset control signal, the second reset control signal and the fuse code in accordance with a cutting of the fuse are outputted through the third node and the fourth node.

6. The NAND flash memory device of claim 2, wherein the register circuit includes registers each having one latch for temporarily storing the corresponding logic code or an inverted form of the corresponding logic code by coupling to the fuse circuit.

7. The NAND flash memory device of claim 6, wherein the latch in each register is coupled between a fifth node and a sixth node, wherein the logic code outputted from the fuse circuit is inputted to the fifth node, and the inverted logic code having a logic level opposed to the logic code is inputted to the sixth node.

8. The NAND flash memory device of claim 7, wherein each register includes:

a third switching means configured to couple the fifth node to the surrounding circuit when activated in accordance with a first control signal outputted from the processor, thereby outputting data stored in the latch;

a fourth switching means and a fifth switching means coupled between the fifth node and a seventh node, coupled between the sixth node and the seventh node, and configured to activate in accordance with a test code and an inverted test code having a logic level opposed to the test code outputted from the test circuit;

a sixth switching means coupled between the seventh node and a ground, and configured to activate in accordance with a second control signal outputted from the processor; and a seventh switching means configured to transmit an inverted signal of data stored in the fifth node outputted through the third switching means to the processor or the input/output pad circuit in accordance with a third control signal outputted from the processor.

9. The NAND flash memory device of claim 8, wherein the processor outputs the second control signal for performing a test operation of the NAND flash memory device, and stores the test code and the inverted test code outputted from the test circuit in the latch.

10. The NAND flash memory device of claim 8, wherein the processor controls the first switching means and the third switching means by outputting the first control signal and the third control signal, thereby outputting the data stored in the fifth node to the input/output pad circuit.

11. The NAND flash memory device of claim 8, wherein the logic code and the inverted logic code in accordance with input of the first and second reset control signals are stored in the fifth node and the sixth node when power is turned on.

12. The NAND flash memory device of claim 8, wherein the data stored in the fifth node are outputted to the surrounding circuit for operation of the NAND flash memory device, and data having a logic level opposed to the data in the fifth node are outputted to the processor.

13. The NAND flash memory device of claim 2, wherein the register circuit includes registers, wherein each register includes:

a first latch coupled to the fuse circuit and configured to temporarily store the logic code outputted from the fuse circuit; and a second register coupled to the fuse circuit, and configured to temporarily store second data having a logic level opposed to first data stored in the first latch and provide the second data to the surrounding circuit.

14. The NAND flash memory device of claim 13, wherein the first latch is coupled between an eighth node and a ninth node, wherein the logic code outputted from the fuse circuit is inputted to the eighth node, and the inverted logic code having a logic level opposed to the logic code is inputted to the ninth node.

15. The NAND flash memory device of claim 13, wherein each register includes:

an eighth switching means and a ninth switching means coupled between the eighth node and a tenth node, coupled between the ninth node and the tenth node, and configured to activate in accordance with a test code and an inverted test code having a logic level opposed to the test code outputted from the test circuit;

a tenth switching means and an eleventh switching means coupled between an eleventh node and a thirteenth node, coupled between a twelfth node and the thirteenth node, and configured to activate in accordance with data stored in the eighth node and the ninth node, wherein the second latch is coupled between the eleventh node and the twelfth node;

a twelfth switching means coupled between the thirteenth node and a ground, and configured to activate in accordance with a fourth control signal outputted from the processor;

a thirteenth switching means coupled between the tenth node and the ground, and configured to activate in accordance with a fifth control signal outputted from the processor; and a fourteenth switching means configured to transmit a signal having a logic level opposed to data stored in the eleventh node to the processor or the input/output pad circuit in accordance with a sixth control signal outputted from the processor.

16. The NAND flash memory device of claim 15, wherein the processor outputs the fifth control signal for a test operation of the NAND flash memory device, stores the test code and the inverted test code outputted from the test circuit in the first latch, and stores the data stored in the first latch in the second latch by outputting the fourth control signal.

17. The NAND flash memory device of claim 15, wherein the processor controls the fourteenth switching means by outputting the sixth control signal, thereby outputting data having a logic level opposed to data stored in the eleventh node to the input/output pad circuit.

18. The NAND flash memory device of claim 15, wherein the logic code and the inverted logic code in accordance with the first reset control signal and the second reset control signal are stored in sequence in the eighth node and the seventh node when power is turned on, and data having a logic level opposed to data in the eighth node and the seventh node are stored in the eleventh node and the twelfth node in accordance with the fourth control signal outputted from the processor.

19. A method of operating a NAND flash memory device having a fuse circuit for storing an initial setting value as logic codes and registers for temporarily storing the logic codes outputted from the fuse circuit, the method comprising:

applying a power source;

generating logic codes to be stored in the fuse circuit in accordance with the applied power source;

storing the generated logic codes in the registers in accordance with whether or not a present operation mode is a test mode; and performing an initial setting by transmitting the logic codes stored in the registers to a surrounding circuit for operation of the NAND flash memory device.

20. The method of claim 19, further comprising:

storing a test code in the register irrespective of the generated logic code when the present operation mode is the test mode; and performing an initial setting by transmitting the test code stored in the register to the surrounding circuit.

21. The method of claim 19, further comprising:
outputting the logic code or the test code stored in the registers to an outside device when the present operation mode is a read mode.

22. The method of claim 19, wherein the logic code or the test code stored in the registers is used as a setting value by transmitting the logic code or the test code to a processor.

* * * * *